United States Patent
Liskow

(10) Patent No.: US 10,869,398 B2
(45) Date of Patent: Dec. 15, 2020

(54) CONTROL MODULE FOR ACTUATING AT LEAST ONE ELECTRICALLY OPERABLE ACTUATOR

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/087,466

(22) PCT Filed: Feb. 24, 2017

(86) PCT No.: PCT/EP2017/054357
§ 371 (c)(1),
(2) Date: Sep. 21, 2018

(87) PCT Pub. No.: WO2017/162402
PCT Pub. Date: Sep. 28, 2017

(65) Prior Publication Data
US 2019/0110368 A1   Apr. 11, 2019

(30) Foreign Application Priority Data
Mar. 23, 2016   (DE) .................. 10 2016 204 811

(51) Int. Cl.
*H05K 7/00* (2006.01)
*H05K 5/00* (2006.01)
(Continued)

(52) U.S. Cl.
CPC .......... *H05K 5/0056* (2013.01); *F16D 28/00* (2013.01); *F16H 61/0006* (2013.01);
(Continued)

(58) Field of Classification Search
USPC ........................................ 361/728
See application file for complete search history.

(56) References Cited

U.S. PATENT DOCUMENTS 5,120,231 A * 6/1992 Masumoto ........... H05K 5/0056
439/736
6,198,183 B1 * 3/2001 Baeumel ............... F04D 25/068
310/52
(Continued)

FOREIGN PATENT DOCUMENTS

CN       101573535 A    11/2009
CN       103002701 A     3/2013
(Continued)

OTHER PUBLICATIONS

International Search Report corresponding to PCT Application No. PCT/EP2017/054357, dated Jun. 2, 2017 (German and English language document) (7 pages).

*Primary Examiner* — Hung S. Bui
(74) *Attorney, Agent, or Firm* — Maginot, Moore & Beck LLP

(57) ABSTRACT

A control module for actuating at least one electrically operable actuator includes an actuator housing, a housing part, a casting space, a circuit carrier, and an electronic control circuit. The actuator housing accommodates the electrically operable actuator. The housing part is formed as one piece on the actuator housing. The casting space is formed on the housing part. The circuit carrier is introduced into the casting space. The electronic control circuit is arranged on the circuit carrier. The circuit carrier is surrounded with a casting mass in the casting space and embedded therein, and electrical connection elements of the circuit carrier are guided outwards out of the casting space.

15 Claims, 2 Drawing Sheets

(51) Int. Cl.
*F16H 61/00* (2006.01)
*H05K 5/06* (2006.01)
*F16H 61/32* (2006.01)
*F16D 28/00* (2006.01)
*H05K 5/02* (2006.01)

(52) U.S. Cl.
CPC .......... *F16H 61/32* (2013.01); *H05K 5/0017* (2013.01); *H05K 5/0082* (2013.01); *H05K 5/0247* (2013.01); *H05K 5/064* (2013.01); *H05K 5/069* (2013.01)

(56) References Cited

U.S. PATENT DOCUMENTS

| | | | | |
|---|---|---|---|---|
| 6,707,185 | B2* | 3/2004 | Akutsu | B62D 5/0406 310/68 B |
| 8,513,541 | B2* | 8/2013 | Hamer | H02K 11/022 174/382 |
| 8,593,099 | B2* | 11/2013 | Shibuya | F04B 39/121 318/461 |
| 9,642,266 | B2* | 5/2017 | Gerhaeusser | H05K 5/0082 |
| 2002/0025265 | A1* | 2/2002 | Ikeda | F04C 29/045 417/410.1 |
| 2003/0143090 | A1* | 7/2003 | Iritani | F04C 23/008 417/410.5 |
| 2004/0197213 | A1* | 10/2004 | Takemoto | F04B 35/04 417/410.1 |
| 2005/0198819 | A1 | 9/2005 | Hunkeler et al. | |
| 2006/0077643 | A1* | 4/2006 | Mayuzumi | H05K 3/284 361/753 |
| 2006/0272150 | A1* | 12/2006 | Eguchi | H05K 3/284 29/841 |
| 2010/0086413 | A1* | 4/2010 | Matsukawa | B60H 1/3222 417/18 |
| 2010/0172770 | A1* | 7/2010 | Ichise | H02K 5/24 417/366 |
| 2013/0058044 | A1* | 3/2013 | Watanabe | H05K 5/006 361/714 |
| 2013/0119834 | A1* | 5/2013 | Nakagami | F04C 23/008 310/68 D |
| 2013/0320792 | A1* | 12/2013 | Fukasaku | H02K 11/022 310/89 |

FOREIGN PATENT DOCUMENTS

| | | |
|---|---|---|
| DE | 10 2011 085 629 A1 | 5/2013 |
| DE | 10 2013 221 239 A1 | 4/2015 |
| DE | 10 2014 200 746 A1 | 7/2015 |

* cited by examiner

CONTROL MODULE FOR ACTUATING AT LEAST ONE ELECTRICALLY OPERABLE ACTUATOR

This application is a 35 U.S.C. § 371 National Stage Application of PCT/EP2017/054357, filed on Feb. 24, 2017, which claims the benefit of priority to Serial No. DE 10 2016 204 811.2, filed on Mar. 23, 2016 in Germany, the disclosures of which are incorporated herein by reference in their entirety.

BACKGROUND

As is generally known, control modules are employed in automotive engineering for the purpose of triggering various electrical actuators. The electrically operable actuators include, for instance, electrically operated clutches in automatic transmissions, actuators for electric steering systems, EC motors for oil pumps, electric window-regulators, dual-clutch transmissions operated by electric motor, electromotive actuating elements in automated manual transmissions, electrical wastegate actuating elements in exhaust-driven turbochargers, throttle-valve actuating elements and many more. The control modules may take the form of simple control units which exhibit a control circuit applied onto a circuit support, which has been inserted into a housing. The control unit may have been fixed in the vehicle as a separate component and may, for instance, have been electrically connected to the actuators to be triggered via a cable harness.

For some time, control modules have been incorporated on or in the transmission for the purpose of triggering transmission clutches. Besides the actual electronic control unit, the control modules may, for instance, exhibit sensors and contacting interfaces to the actuators. The electronic control circuit of transmission control modules has to be protected against the aggressive transmission fluid. For this purpose, potting compounds are also employed which are applied onto a circuit support of the electronic control circuit for protection. For instance, from DE 10 2011 085 629 A1 an electronic module for triggering actuators of a transmission is known which exhibits a cup-type housing and a circuit support, arranged in the cup-type housing, with connection elements. The circuit support has been potted with a potting compound for its protection in the cup-type housing. The connection elements project from the potting compound and serve partly for connection to the power supply, to an EC motor, to sensors and/or to a LIN bus or CAN bus. The cup-type housing can be fastened to a housing part of the transmission or of the transmission hydraulics via fastening means.

SUMMARY

The disclosure relates to a control module for triggering at least one electrically operable actuator. The control module comprises a housing part, on which a potting space is formed, and a circuit support, inserted into the potting space, on which an electronic control circuit is arranged, said circuit support being encapsulated in the potting space with a potting compound and embedded therein, and electrical connection elements of the circuit support being guided out of the potting space to the outside. In accordance with the disclosure, it is proposed that the housing part on which the potting space is formed is integrally formed on an actuator housing receiving the electrically operable actuator.

The control module according to the disclosure is advantageously integrated into the actuator housing, so that construction space, costs and weight can be reduced in comparison with the known solutions which exhibit a specific housing for the control module. A separately provided cup-type housing is dispensed with and is advantageously replaced by an appropriately designed actuator housing. A lid is likewise not required, by reason of the embedding into a media-resistant potting compound. The separate fastening means for fastening the control module can advantageously also be dispensed with, since these can be replaced by the fastening means which have already been provided anyway on the actuator housing. All the manufacturing steps for producing the control module according to the disclosure can advantageously be carried out economically on an assembly line by virtue of a highly integrated manufacturing process. The dissipation of heat from the circuit support via separate heat sinks can advantageously be dispensed with. Instead of this, the dissipation of heat takes place directly via the potting compound. Since the circuit support equipped with the electronic control circuit has been completely embedded into the potting compound, advantageously no volume of air is included. Therefore a separate pressure-compensating element which is otherwise required can be dispensed with. The potting compound encases the circuit support with the electronic control circuit sufficiently against all environmental influences. In addition, the circuit support equipped with the electronic control circuit is vibration-damped by the potting compound, so that additional damping means can be dispensed with.

Advantageous embodiments and further developments of the disclosure are made possible by the features described in the dependent claims.

By virtue of the fact that an interior space, intended for receiving the actuator, of the actuator housing is separated from the potting space by a dividing wall, the encasing and integration of the electronic control circuit into the actuator housing can be undertaken completely independently of the arrangement of the electrical actuator in the actuator housing.

Particularly advantageous is an embodiment example in which at least one electrical contact element of the electronic control circuit has been guided through a breach, provided in the dividing wall, from the potting space as far as the interior space of the actuator. As a result, a cable harness, installed outside the actuator housing, between the electronic control circuit and the electric actuator can advantageously be dispensed with. The electrical contact element can, for instance, be pressed as a press-in part into the circuit support and can be electrically contacted with the control circuit on the circuit support. The contact element can also be mounted onto the circuit support and soldered to conductor tracks or contact surfaces of the circuit support. The electrical contacting between the contact element and the electronic control circuit is effected in the known manner by virtue of conductor tracks and contact surfaces of the circuit support.

Alternatively, instead of the breach there may also be provision to inject the at least one electrical contact element as an insert into the dividing wall of the actuator housing, so that it protrudes from the dividing wall on both sides, on the one hand in the direction of the actuator, and on the other hand in the direction of the potting space. Subsequently the circuit support can be pressed onto the end of the at least one electrical contact element protruding into the potting space. In this case, a sealing element can be dispensed with.

If a breach for guiding the at least one contact element through is provided in the dividing wall, a sealing element surrounding the electrical contact element may advantageously have been inserted into the breach. The sealing element seals the potting space in relation to the interior space of the actuator housing, so that in the course of pouring in the potting compound the potting space can be filled up without the potting compound penetrating into the interior space of the actuator housing. In addition, the sealing element constitutes an additional protective wall which separates the interior space of the actuator from the potting space with the electronic control circuit.

The potting space may have been formed in straightforward manner in the shape of a trough with a bottom and with a peripheral side wall bounding an opening of the potting space. The contact element may protrude from the circuit support in the direction of the bottom on a side of the potting space facing away from the opening. In the course of the assembly of the circuit support the latter is inserted into the potting space through the opening. In the process, the contact element is automatically introduced into the breach provided for it, or the circuit support is pressed onto the contact element which has been pressed in the dividing wall.

Advantageously, at least one spacer may have been provided on the bottom, said spacer protruding from the bottom in the direction of the potting space. The circuit support is held at a distance from the bottom of the potting space by abutment against the at least one spacer. The interspace formed thereby between the circuit support and the bottom is filled with the potting compound in the course of potting. By this means, it is advantageously ensured that the circuit support has been covered with the potting compound also on its side facing toward the bottom. Consequently there is good protection also against media that, for instance, try to penetrate from the interior space of the actuator housing in the direction of the potting space along the electrical contact elements. In addition, all the electrical elements that protrude from the circuit support toward the bottom are individually sheathed by the potting compound and insulated from one another. They are therefore protected against short circuits which could be brought about, for instance, by metal shavings generated during the manufacture of the actuator housing, which without the potting compound might migrate by reason of vibrations arising in operation.

The electrical connection elements of the circuit support are advantageously formed on a plug part which projects from the potting compound. The plug part serves for the power supply and for the connection of the electronic control circuit to an external control unit and/or to external components which have been provided where appropriate.

Particularly advantageous is an embodiment example in which the plug part exhibits an inner surface facing toward the circuit support, from which the electrical connection elements protrude in the direction of the circuit support, and the inner surface is spaced from the circuit support, at least in a region surrounding the electrical connection elements, by a gap. This gap is automatically filled with the potting compound in the course of the potting of the circuit support, so that exposed portions of the electrical connection elements in the gap have each been sheathed with the potting compound between the circuit support and the inner surface of the plug part. As a result, it is advantageously ensured that the electrical connection elements integrated into the plug part, irrespective of the embedding thereof into the plug part, are completely sealed off toward the outside, without a separate sealing element being required for this purpose. Moisture and other contaminating media are therefore unable to penetrate as far as the circuit support through gaps in the plug part along the connection elements, since the sheathing of the connection elements by means of the potting compound constitutes an effective barrier.

The plug part may advantageously abut the housing part on the side of the housing part pointing away from the dividing wall. The abutment surface on the housing part can serve for support and mechanical relief. If necessary, the plug part can be fastened to the housing part.

In an advantageous embodiment example, the actuator housing is designed in the form of a cylinder with a cylindrical outer sheath, and the housing part takes the form of a balcony-like extension on the outer sheath of the actuator housing.

The electrically operable actuator may include, for instance, at least one electrically operated actuating drive, in particular an electric clutch-actuating element, or an electric motor, in particular a BLDC motor, without being restricted to these applications.

BRIEF DESCRIPTION OF THE DRAWINGS

Shown are.

DETAILED DESCRIPTION

Figure 1:
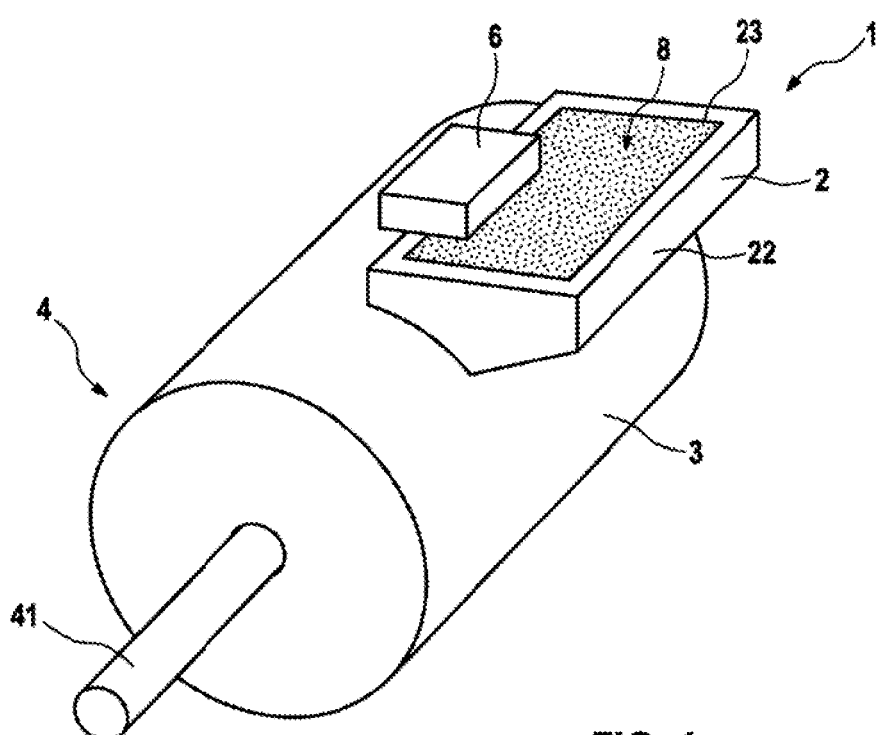
FIG. 1 a top view of a control module for triggering at least one electrically operable actuator
FIG. 2 a partial cross section through FIG. 1.

FIG. 1 shows an embodiment example of a control module for triggering at least one electrically operable actuator. The electric actuator 4 is, for instance, a BLDC motor (BLDC=brushless direct-current) or EC motor (EC=electronically commutated)—that is to say, an electric motor that has been constructed as a three-phase synchronous machine with excitation by permanent magnets. Of the electric actuator 4, only the actuator housing 3 and a drive shaft 41, which protrudes from the actuator housing 3, are represented in FIG. 1. The drive shaft 41 may serve, for instance, for driving an oil pump in a motor-vehicle transmission. The actuator housing 3 is, for instance, designed in the form of a cylinder and exhibits an interior space 11 which can only be discerned in FIG. 2 and which serves for receiving the actual electric actuator. The latter includes the stator and rotor of an electric machine which is not represented, and also the drive shaft 41 which can be discerned in FIG. 1 and which is coupled with the rotor.

The disclosure is by no means restricted to the electric actuator 4 which is represented. The electric actuator may be any electrically operable actuator that exhibits an actuator housing. For instance, it may be a question of an electrically operated clutch in an automatic transmission, an actuator for electric steering systems, for an electric window-regulator, a dual-clutch transmission operated by electric motor, an electromotive actuating element of an automated manual transmission, an electric wastegate actuating element in exhaust-driven turbochargers, or the like. What is important is that the actuator is triggered electrically and is inserted into an actuator housing. The actuator housing 3 does not necessarily have to be cylindrical and may also have other shapes. In particular, an actuator housing for receiving several actuators may also have been provided. In this case, several internal spaces 11 may have been formed in the actuator housing.

In accordance with the disclosure, a housing part 2 serving for receiving an electronic control circuit for triggering the actuator 4 is formed integrally or, to be more exact in one piece, on the actuator housing 3. The housing part 2 may have been molded onto the actuator housing 3 on the outside. In the embodiment example shown in FIG. 1, the actuator housing is designed in the form of a cylinder with a cylindrical outer sheath and two front faces is. The housing part 2 protrudes as a balcony-like extension on the outer sheath of the actuator housing—that is to say, it has been constructed in one piece with the actuator housing. The actuator housing 3 with the housing part 2 may, for instance, have been manufactured from metal, in particular from aluminum, or from synthetic material.

Figure 2:
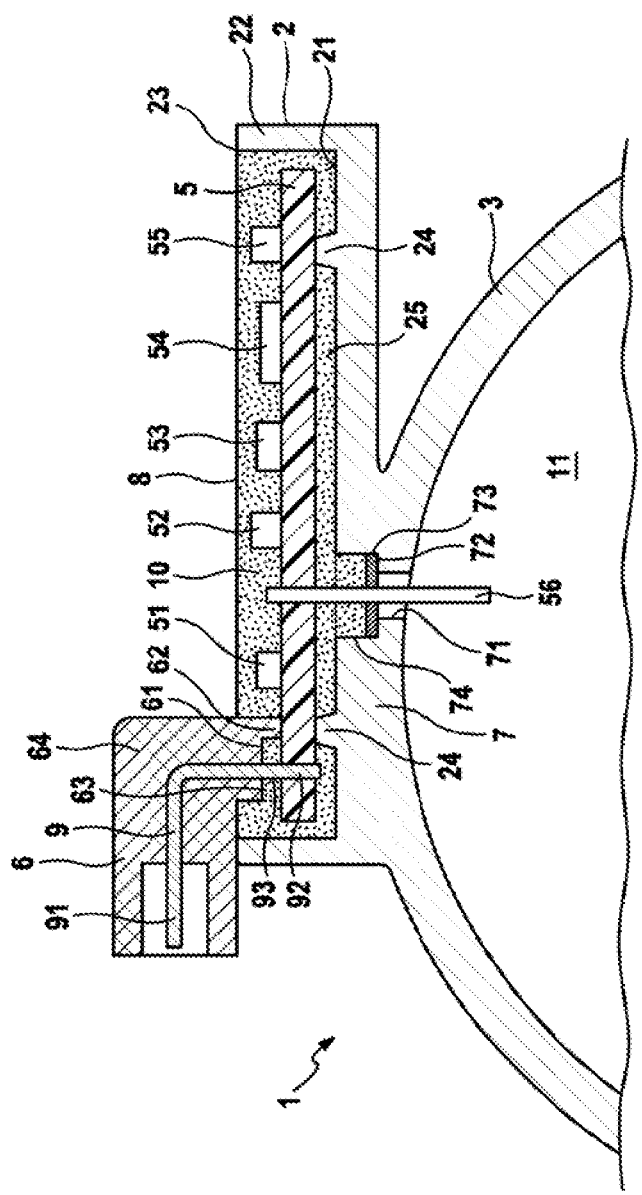

The housing part 2 exhibits a potting space 10 represented in FIG. 2. This potting space 10 is separated from the interior space 11 of the actuator housing by a dividing wall 7 of the actuator housing 3. Although other designs are conceivable, the embodiment that is represented is particularly advantageous, in which the potting space 10 is designed in the form of a trough with a bottom 21 and with a peripheral side wall 22 bounding an opening 23 of the potting space 10. In this embodiment, a circuit support 5 can be inserted in straightforward manner into the potting space through the opening 23, and at the same time the electrical linkage of the circuit support 5 to the electric actuator in the interior space 11 of the actuator housing 3 can be ensured via contact elements 56 which have been guided through the dividing wall 7 forming the bottom 21.

The circuit support 5 is preferably, for instance, a printed circuit board (PCB) made of glass-fiber-reinforced epoxy-resin material (FR4 or higher grade) with conductor tracks on one or more layers, which on at least one side is equipped with the electrical and/or electronic components 51 to 55 of an electronic control circuit. Of course, a different circuit support—for instance, a ceramic substrate, a flexible printed circuit board or other—may also be used.

Besides the electrical and/or electronic components 51 to 55, the circuit support 5 is equipped with at least one plug part 6. The plug part 6 consists of a base body 64 made of insulating material, into which electrical connection elements 9 have been sunk. The connection elements 9 each exhibit an exposed end 91 for the external connection and an end 92 for the connection to the circuit support 5. The ends 92 protrude in the direction of the circuit support 5 on an inner surface 61 of the plug part 6 facing toward the circuit support 5, and have been introduced there into contacting openings of the circuit support 5. The electrical linkage of the ends 92 to the circuit support 5 can be effected, for instance, by pressing into the contacting openings or by soldering. On the inner surface 61 the plug part 6 exhibits, for instance, a projection 62 for resting on the circuit support 5. By abutment of the projection 62 against the circuit support 5, but also in some other suitable manner, a gap 63 between the inner surface 61 and the circuit support 5 can be adjusted in a region surrounding the connection elements 9. In the gap 63, a portion 93 of the connection elements 9 is exposed in each instance prior to the potting of the circuit support.

The bottom 21 of the potting space 10 further exhibits at least one spacer 24 which protrudes from the bottom 21. In particular, three or more spacers 24 may have been provided, which constitute bearing-points for the plate-shaped circuit support 5.

Furthermore, the circuit support 5 is equipped with, for instance, pin-shaped electrical contact elements 56 which, for instance, have been pressed into the circuit support 5 and have been electrically connected to the electronic control circuit. In the cross section shown in FIG. 2 only one electrical contact element 56 can be discerned. The linkage of the contact elements 56 to the circuit support 5 can be effected prior to or during the introduction of the circuit support 5 into the potting space 20. The contact elements 56 serve as phase connections between the circuit support 5 and the electric machine in the interior space 11 of the actuator housing 3, and also for linkage to rotor-position sensors arranged, where appropriate, in the interior space 11.

Furthermore, a breach 71, 74 in the dividing wall 7 has, for instance, been respectively assigned to each electrical contact element 56 in FIG. 2. The breach 7 may, as a stepped bore, consist of a first bore portion and a second bore portion 74, the second bore portion 74 having a larger inside diameter in comparison with the first bore portion 71, so the a shoulder 72 is formed between the first bore portion 71 and the second bore portion 74. A sealing element 73 which is supported on the shoulder 72 has been inserted into the breach. Deviating therefrom, however, instead of a plurality of breaches only a single common breach may have been provided for all the contact elements.

In the course of the assembly of the circuit support 5 the latter is inserted into the potting space 10 through the opening 23 and arrives at a position of abutment against the spacers 24. By virtue of the abutment against the spacers 24, the circuit support is held at a distance from the bottom 21 of the potting space 10, so that an interspace 25 is formed between the circuit support 5 and the bottom 21.

In the course of assembly the contact elements 56 are inserted into the respectively assigned breach 71, 74 and in the process respectively penetrate the sealing element 73 inserted there. Each sealing element 73 bears tightly against the assigned contact element 56 and seals the corresponding breach between the interior space 11 and the potting space 10. The plug part 6 mounted onto the circuit support 5 arrives at a position of abutment against the peripheral wall 22 of the housing part 2 when the circuit support 5 is being inserted, and can be fastened there where appropriate.

Subsequently the potting compound 8 is poured into the potting space 10. By way of potting compound, an epoxy-resin compound with a CTE (coefficient of thermal expansion) in the region of 20 ppm/K preferentially finds application, since this coefficient is approximately of the same magnitude as the CTE of the housing part 2 (made of aluminum with 23 ppm/K) and the CTE of the circuit support of the printed circuit board of 18 ppm/K. Thermal stresses can advantageously be avoided in this way.

The thermal conduction of the epoxy resin is at least 0.9 W/mK as good as in the case of known heat-conducting adhesives. Thermal-conduction values of 2 W/mK and higher are preferred, in order to enable a good dissipation of heat from the electronic control circuit.

In other embodiment examples, other substances—such as acrylate, silicone or urethane—may be employed as potting compound if they have a sufficient resistance to the medium in the exterior space. Preferred, however, are epoxy resins (amines crosslinking with acid anhydride, aminically or cationically, or aliphatic amines) that combine the properties of good adhesion to the materials being employed with good chemical resistance, thermal conductivity as well as mechanical and thermal strength.

The potting compound 8 may, for instance, fill the entire potting space 10 as far as the upper edge, and in the process also penetrates, in particular, into the interspace 25 between the circuit support 5 and the bottom 21 and into the gap 63 between the inner surface 61 and the circuit support 5. As a result, both the electrical contact elements 56 and the portions 93 of the connection elements 9 that are exposed in the gap 63 are respectively sheathed with the potting compound. The circuit support 5 is completely embedded into the potting compound 8. Since the electrical and/or electronic components 51 to 55 may include ceramic capacitors (MLCC=metal layer ceramic capacitor) which are susceptible to fracture, by virtue of the potting compound 8 a protection of the ceramic capacitors against vibrations and thermal stresses is obtained. Should a ceramic capacitor nevertheless be damaged, the potting compound prevents the danger of fire in the event of a short circuit, since no atmospheric oxygen is present in the vicinity of the short circuit.

Only the plug part 6 in FIG. 2 has been guided to the outside on the potting compound 8 through the opening 23 on the potting space 10. In addition to the plug part 6, further contact elements and/or plug parts may have been guided out of the potting compound 8 upward out of the potting space.

The invention claimed is:

1. A control module for triggering at least one electrically operable actuator, comprising:
    an actuator housing configured to receive the at least one electrically operable actuator, an integral portion of the actuator housing formed in one piece with the actuator housing and defining a potting space;
    a circuit support positioned within the potting space;
    an electronic control circuit positioned within the potting space and on the circuit support, the electronic control circuit including electrical connection elements that extend out from the potting space; and
    a potting compound disposed in the potting space so as to encapsulate the circuit support and the electronic control circuit within the potting space, wherein the electrical connection elements of the circuit support extend through the potting compound so that the electrical connection elements are accessible outside of the potting space,
    wherein the integral portion of the actuator housing is configured such that the potting compound is exposed to an exterior of the actuator housing.

2. The control module as claimed in claim 1, wherein the actuator housing includes:
    an interior space configured to receive the at least one electrically operable actuator; and
    an integral dividing wall formed in one piece with the actuator housing, the integral dividing wall defining at least a portion of the interior space and at least a portion of the potting space, such that the integral dividing wall directly separates the potting space from the interior space.

3. The control module as claimed in claim 2, wherein:
    the electronic control circuit further includes at least one electrical contact element;
    the integral dividing wall includes a breach between the potting space and the interior space; and
    the at least one electrical contact element extends through the breach in the dividing wall.

4. The control module as claimed in claim 3, further comprising:
    a sealing element positioned in the breach, the sealing element surrounding the at least one electrical contact element and sealing the potting space from the interior space.

5. The control module as claimed in claim 3, wherein the circuit support is mounted on the at least one electrical contact element.

6. The control module as claimed in claim 5, wherein the circuit support is fixed to the at least one electrical contact element via a press fit connection.

7. The control module as claimed in claim 1, wherein the integral portion of the actuator housing includes a bottom and a peripheral side wall that form a trough, the peripheral side wall bounding an opening of the potting space.

8. The control module as claimed in claim 7, wherein:
    the electronic control circuit further includes at least one electrical contact element; and
    the at least one electrical contact element extends from the circuit support in a direction away from the opening of the potting space and protrudes out from the potting space through the bottom of the integral portion of the actuator housing.

9. The control module as claimed in claim 7, further comprising:
    at least one spacer positioned on the bottom of the potting space, wherein:
        the circuit support is mounted on the at least one spacer such that the circuit support is positioned at a distance from the bottom, the distance defining an interspace between the circuit support and the bottom; and
        the potting compound is disposed in the potting space such that the interspace is filled with the potting compound.

10. The control module as claimed in claim 1, further comprising:
    a plug part projecting from the potting compound,
    wherein the electrical connection elements of the circuit support are arranged on the plug part.

11. The control module as claimed in claim 10, wherein:
    the plug part includes an inner surface facing toward the circuit support;
    the inner surface is spaced apart from the circuit support by a gap at least in a region surrounding the electrical connection elements;
    the electrical connection elements are partially received in the plug part such that portions of the electrical connection elements protrude out from the inner surface of the plug part and into the gap in a direction of the circuit support; and
    the potting compound is disposed in the potting space such that the gap is filled with the potting compound, and such that each of the protruding portions of the electrical connection elements in the gap is sheathed with the potting compound.

12. The control module as claimed in claim 10, wherein:
    the actuator housing includes:
        an interior space configured to receive the at least one electrically operable actuator; and
        an integral dividing wall formed in one piece with the actuator housing, the integral dividing wall defining at least a portion of the interior space and at least a portion of the potting space, such that the integral dividing wall directly separates the potting space from the interior space;
    the integral portion of the actuator housing defines a side facing away from the integral dividing wall; and
    the plug part bears against the side of the integral portion of the actuator housing.

13. The control module as claimed in claim 1, wherein:
    the actuator housing has a cylindrical shape, and includes a cylindrical outer sheath; and the integral portion of the actuator housing has a balcony-like cantilevered shape that extends from the cylindrical outer sheath of the actuator housing.

14. The control module as claimed in claim 1, wherein the at least one electrically operable actuator includes at least one electrically operated actuating drive.

15. The control module as claimed in claim 14, wherein the at least one electrically operated actuating drive is an electric clutch-actuating element, an electric motor, or a BLDC motor.

* * * * *